(12) United States Patent
Kwak

(10) Patent No.: US 7,046,059 B2
(45) Date of Patent: *May 16, 2006

(54) DELAY LOCKED LOOP AND ITS CONTROL METHOD

(75) Inventor: Jong-Tae Kwak, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 18 days.

This patent is subject to a terminal disclaimer.

(21) Appl. No.: 10/883,332

(22) Filed: Jun. 30, 2004

(65) Prior Publication Data

US 2005/0093597 A1 May 5, 2005

(30) Foreign Application Priority Data

Oct. 29, 2003 (KR) ...................... 10-2003-0075939

(51) Int. Cl.
*H03L 7/06* (2006.01)

(52) U.S. Cl. ...................................... 327/158; 327/175

(58) Field of Classification Search ...................... None
See application file for complete search history.

(56) References Cited

U.S. PATENT DOCUMENTS

| 5,614,855 | A | 3/1997 | Lee et al. |
| 5,945,862 | A | 8/1999 | Donnelly et al. |
| 6,342,801 | B1 | 1/2002 | Shin |
| 6,384,652 | B1 | 5/2002 | Shu |
| 6,466,071 | B1 | 10/2002 | Kim et al. |
| 6,518,809 | B1 | 2/2003 | Kotra |
| 6,750,688 | B1 * | 6/2004 | Takai .......................... 327/158 |
| 6,853,225 | B1 * | 2/2005 | Lee ............................. 327/158 |
| 6,917,229 | B1 * | 7/2005 | Cho ............................ 327/158 |
| 2004/0062121 | A1 | 4/2004 | Chung et al. |
| 2004/0066873 | A1 | 4/2004 | Cho et al. |
| 2005/0024107 | A1 * | 2/2005 | Takai et al. ................. 327/158 |
| 2005/0028019 | A1 * | 2/2005 | Kim ............................ 713/500 |
| 2005/0110540 | A1 * | 5/2005 | Kwak ......................... 327/158 |

* cited by examiner

*Primary Examiner*—Timothy P. Callahan
*Assistant Examiner*—Cassandra Cox
(74) *Attorney, Agent, or Firm*—Blakely Sokoloff Taylor & Zafman

(57) ABSTRACT

A delay locked loop (DLL) capable of correcting a duty ratio of a clock signal including: a clock buffer which receives an external clock signal for outputting a rising edge clock signal; a delay unit for delaying the rising edge clock signal based on a first comparison signal in order to generate a first internal clock signal, a second internal clock signal, a first delay locking signal and a second delay locking signal; a duty correction unit for receiving the first and the second internal clock signals and the first and the second delay locking signals and generating a delay locked clock signal by correcting a duty cycle of the external clock signal; and a clock feed-back unit for receiving the delay locked clock signal and the external clock signal in order to generate the first comparison signal.

28 Claims, 10 Drawing Sheets tCK : clock period

DELAY LOCKED LOOP AND ITS CONTROL METHOD

FIELD OF INVENTION

The present invention relates to a delay locked loop (DLL); and, more particularly, to an apparatus and a method for compensating a skew between an internal clock signal and an external clock signal and for correcting a duty error.

DESCRIPTION OF PRIOR ART

Generally, a delay locked loop (DLL) is used for a synchronous semiconductor memory device in order to synchronize an internal clock signal with an external clock signal. In the synchronous semiconductor memory device, data access operations such as a read operation and a write operation are performed in synchronization with rising and falling edges of the external clock signal.

Since there is a time delay while the external clock signal is inputted to the synchronous semiconductor memory device, the DLL is employed for synchronizing the internal clock signal with the external clock signal by compensating the time delay between the internal clock signal and the external clock signal.

However, in case of a double data rate (DDR) synchronous semiconductor memory device, the data access operations are performed at both of a rising edge and a falling edge of the internal clock signal. Therefore, it is required that the internal clock signal have a 50% of duty ratio.

Various techniques of the DLL have been introduced for compensating a skew between the internal clock signal and the external clock signal and for correcting a duty cycle.

FIG. 1 is a block diagram showing a conventional DLL disclosed in a commonly owned application, U.S. Ser. No. 10/331,412, filed on Dec. 30, 2002, entitled "DIGITAL DLL APPARATUS FOR CORRECTING DUTY CYCLE AND METHOD THEREOF", which is incorporated herein by reference.

As shown, the conventional DLL includes a buffer 110, a delay line unit 120, a duty error controller 130, a first delay model unit 140, a first direct phase detector 150, a second delay model unit 160 and a second direct phase detector 170.

The buffer 110 receives an external clock signal ext_clk and generates a first internal clock signal which becomes activated at an edge of the first internal clock signal. The first internal clock signal is inputted to the delay line unit 120.

The delay line unit 120 receives the first internal clock signal and also receives a first and a second detection signals from the first and the second direct phase detectors 150 and 170. The delay line unit 120 delays the first internal clock signal based on the first and the second detection signals and outputs a first delayed internal clock signal intclk1 and a second delayed internal clock signal intclk2 to the duty error controller 130.

In detail, the delay line unit 120 includes a first controller 121, a first delay line 122, a second controller 123 and a second delay line 124.

The first controller 121 generates a first control signal for controlling a delay amount according to the first detection signal and outputs the first control signal to the first delay line 122.

The first delay line 122 receives the first control signal and the first internal clock signal. The first internal clock signal is delayed according to the first control signal in the delay line 122. That is, the first delay line 122 generates the first delayed internal clock signal intclk1 by delaying the first internal clock signal according to the first control signal. The first delayed internal clock signal intclk1 is outputted to the duty error controller 130.

The second controller 123 generates a second control signal for controlling a delay amount according to the second detection signal and outputs the second control signal to the second delay line 124.

The second delay line 124 receives the second control signal and the first internal clock signal. The second delay line 124 delays the first internal clock signal based on the second control signal. Then, the delayed first internal clock signal is inverted and outputted as the second delayed internal clock signal intclk2. The second delayed internal clock signal intclk2 is outputted to the duty error controller 130.

The duty error controller 130 receives the first and the second internal clock signals intclk1 and intclk2. The duty error controller 130 generates a first duty controlled clock signal int_clk and a second duty controlled clock signal intclk2' by shifting falling edges of the first and the second duty controlled clock signals int_clk and intclk2' to a middle of the falling edges of the first and the second duty controlled clock signals int_clk and intclk2'. Herein, after the first and the second duty controlled clock signals int_clk and intclk2' are duty corrected by shifting their falling edges as mentioned above, they become a same clock signal each of which has a 50% duty ratio. The first and the second duty controlled clock signals int_clk and intclk2' are respectively outputted to the first and the second delay model units 140 and 160.

The duty error controller 130 includes a first phase detector 131, a mixer controller 132, a first phase mixer 133 and a second phase mixer 134.

The first and the second delayed internal clock signals intclk1 and intclk2 are inverted and inputted to the first phase detector 131. The first phase detector 131 compares phases of falling edges of the first and the second delayed internal clock signals intclk1 and the intclk2 to determine which one of their falling edges leads the other for generating a phase detection signal based on the comparison result. The phase detection signal is outputted to the mixer controller 132.

The mixer controller 132 receives the phase detection signal to determine a weight k, which contains a difference between two falling edges of the first and the second delayed internal clock signals intclk1 and intclk2, according to the phase detection signal. The weight k is outputted to the first and the second phase mixers 133 and 134. The weight k includes the plural number of weight signals.

The first phase mixer 133 receives the weight k, the first and the second delayed internal clock signals intclk1 and intclk2. The first phase mixer 133 calculates a difference value by subtracting the weight k from 1. By applying the difference value to the first delayed internal clock signal intclk1 and applying the weight k to the second delayed internal clock signals intclk2, the first phase mixer 133 generates a first duty controlled clock signal int_clk. The first duty controlled clock signal int_clk is outputted to the first delay model unit 140.

The second phase mixer 134 receives the weight k and calculates a difference value by subtracting the weight k from 1. The second phase mixer 134 generates a second duty controlled clock signal intclk2' by applying the weight k to the first delayed internal clock signal intclk1 and applying the difference value to the second delayed internal clock signal intclk2. The second phase mixer 134 outputs the second duty controlled clock signal intclk2' to the second delay model unit 160.

Herein, as mentioned above, the first and the second duty controlled clock signals int_clk and intclk2' are generated by shifting their falling edges to a middle of their falling edges; and a direction and a amount of the shift is determined by the weight k and the difference value.

The first delay model unit 140 receives the first duty controlled clock signal int_clk and estimates a delay amount generated while the external clock signal ext_clk is passed through the conventional DLL to be outputted as the first and the second duty controlled clock signals int_clk and intclk2'. The first delay model unit 140 generates a first compensated clock signal iclk1 based on the estimated delay amount and outputs the first compensated clock signal iclk1 to the first direct phase detector 150.

The first direct phase detector 150 receives the external clock signal ext_clk and generates the first detection signal by comparing the external clock signal ext_clk with the first compensated clock signal iclk1. The first direct phase detector 150 outputs the first detection signal to the delay line unit 120.

The second delay model unit 160 receives the second duty controlled clock signal intclk2' and estimates a delay amount generated while the second duty controlled clock signal intclk2' travels to a data input/output pin (DQ pin). The second delay model unit 160 generates a second compensated clock signal iclk2 based on the estimated delay amount and outputs the second compensated clock signal iclk2 to the second direct phase detector 170.

The second direct phase detector 170 receives the external clock signal ext_clk and generates the second detection signal by comparing the external clock signal ext_clk and the second compensated clock signal iclk2. The second direct phase detector 170 outputs the second detection signal to the delay line unit 120.

FIG. 2 is a flow chart showing an operation of the conventional DLL.

The first direct phase detector 150 determines whether or not a rising edge of the first compensated clock signal iclk1 is synchronized with that of the external clock signal ext_clk at a step S201. Likewise, the second direct phase detector 170 determines whether or not a rising edge of the second compensated clock signal iclk2 is synchronized with that of the external clock signal ext_clk at the step S201. Then, if each of rising edges of the first and the second compensated clock signals iclk1 and iclk2 is synchronized with a rising edge of the external clock signal ext_clk, an operation of a step S203 is performed. On the other hand, if each of rising edges of the first and the second compensated clock signals iclk1 and iclk2 is not synchronized with a rising edge of the external clock signal ext_clk, delay amounts of the first and the second delay lines 122 and 124 are adjusted at a step S202.

Thereafter, at the step S203, the first phase detector 131 receives inverted signals of the first and the second delayed internal clock signals intclk1 and intclk2 and determines which one of falling edges of the first and the second delayed internal clock signals intclk1 and intclk2 leads the other.

Thereafter, at a step S204, a weight which is larger than 0.5 is applied to one of the first and the second delayed internal clock signals intclk1 and intlck2 who has a leading falling edge, and a weight which is smaller than 0.5 is applied to the other.

As described above, to synchronizes rising edges of the first and the second delayed internal clock signals intclk1 and intclk2 with a rising edge of the external clock signal ext_clk, the conventional DLL includes two feed-back loops one of which is formed by the first delay line 122, the first phase mixer 133, the first delay model unit 140, the first direct phase detector 150 and the first controller 121 and the other is formed by the second delay line 124, the second phase mixer 134, the second delay model unit 160, the second direct phase detector and the second controller.

However, a phase mixer, a delay model unit and a phase detector included in each of the two feed-back loops have a large size and consume much power. Therefore, since the conventional DLL includes two feed-back loops, a size of the conventional DLL is increased and a power consumption of the conventional DLL is also increased. Therefore, the conventional DLL may not be suitable to a small sized and low power consumed semiconductor memory device.

In addition, the two feed-back loops should have a same delay amount. However, due to some variations such as a manufacturing process, a voltage and a temperature, a delay amount of one of the two feed-back loops may be different from that of the other.

SUMMARY OF INVENTION

It is, therefore, an object of the present invention to provide a DLL and a method for synchronizing an internal clock signal with an external clock signal and for correcting a duty ratio of the internal clock signal consuming low power and having a small size.

In accordance with an aspect of the present invention, there is provided a delay locked loop (DLL) capable of correcting a duty ratio of a clock signal including: a clock buffer which receives an external clock signal for outputting a rising edge clock signal; a delay unit for delaying the rising edge clock signal based on a first comparison signal in order to generate a first internal clock signal, a second internal clock signal, a first delay locking signal and a second delay locking signal; a duty correction unit for receiving the first and the second internal clock signals and the first and the second delay locking signals and generating a delay locked clock signal by correcting a duty cycle of the external clock signal; and a clock feed-back unit for receiving the delay locked clock signal and the external clock signal in order to generate the first comparison signal.

In accordance with another aspect of the present invention, there is provided a delay locked loop (DLL) capable of correcting a duty ratio of a clock signal including: a clock buffer which receives an external clock signal for outputting a rising edge clock signal; a delay unit for delaying the rising edge clock signal based on a first comparison signal in order to generate a first internal clock signal, a second internal clock signal, a first delay locking signal and a second delay locking signal; a duty correction unit which receives the first and the second internal clock signals and the first and the second delay locking signals for generating a delay locked clock signal by correcting a duty cycle of the external clock signal; and a clock feed-back unit which receives the delay locked clock signal and the rising edge clock signal in order to generate the first comparison signal.

In accordance with further another aspect of the present invention, there is provided a delay locked loop (DLL) capable of correcting a duty ratio of a clock signal including: a first clock buffer which receives an external clock signal for outputting a first rising edge clock signal; a second clock buffer which receives the external clock signal for outputting a second rising edge clock signal; a delay unit for delaying the rising edge clock signal based on a first comparison signal in order to generate a first internal clock signal, a second internal clock signal, a first delay locking signal and a second delay locking signal; a duty correction unit which receives the first and the second internal clock signals and the first and the second delay locking signals for generating a delay locked clock signal by correcting a duty cycle of the external clock signal; and a clock feed-back unit which receives the delay locked clock signal and the external clock signal in order to generate the first comparison signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) in accordance with the present invention will be described in detail referring to the accompanying drawings.

Figure 1:
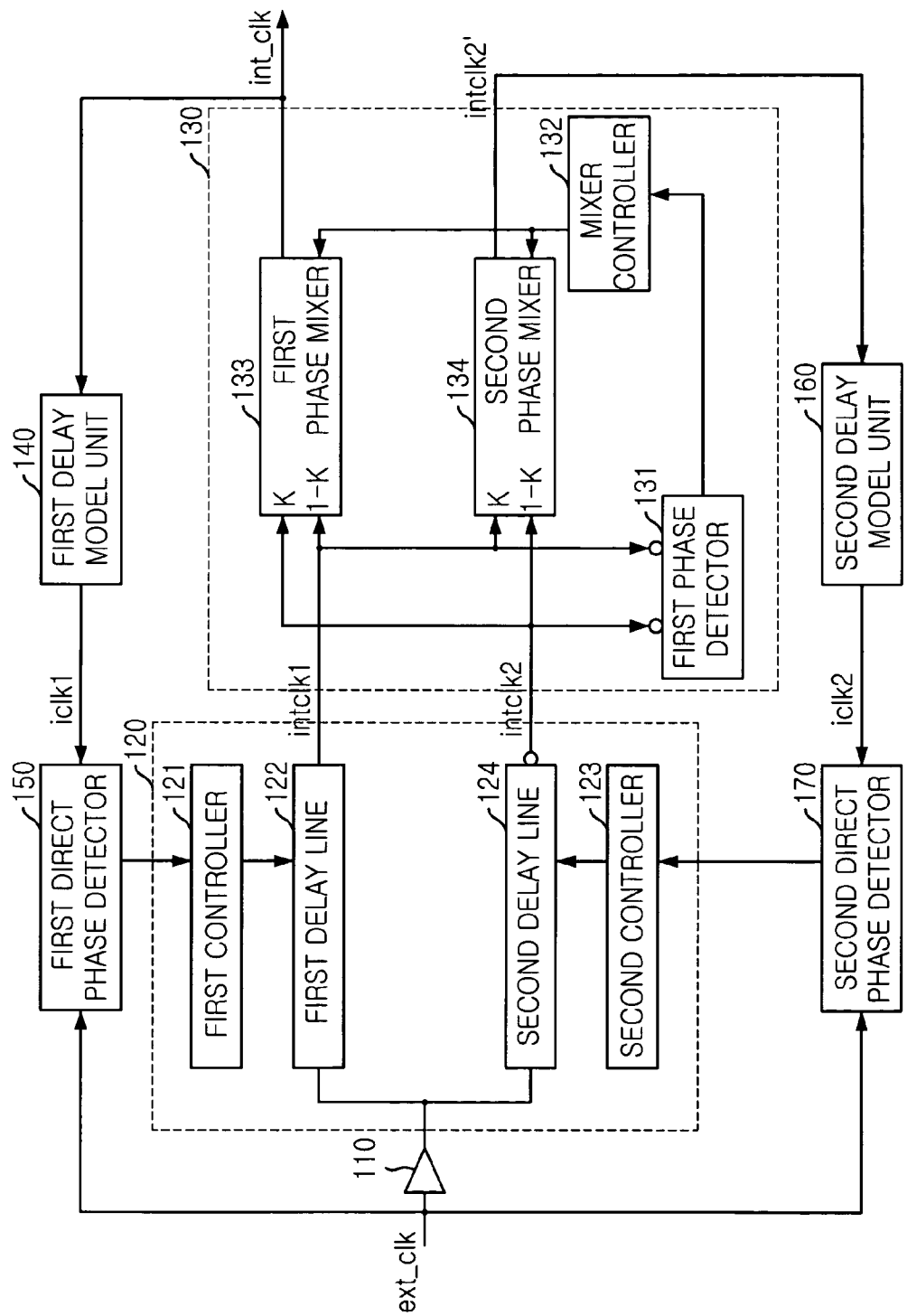
FIG. 1 is a block diagram showing a conventional DLL.
Figure 2:
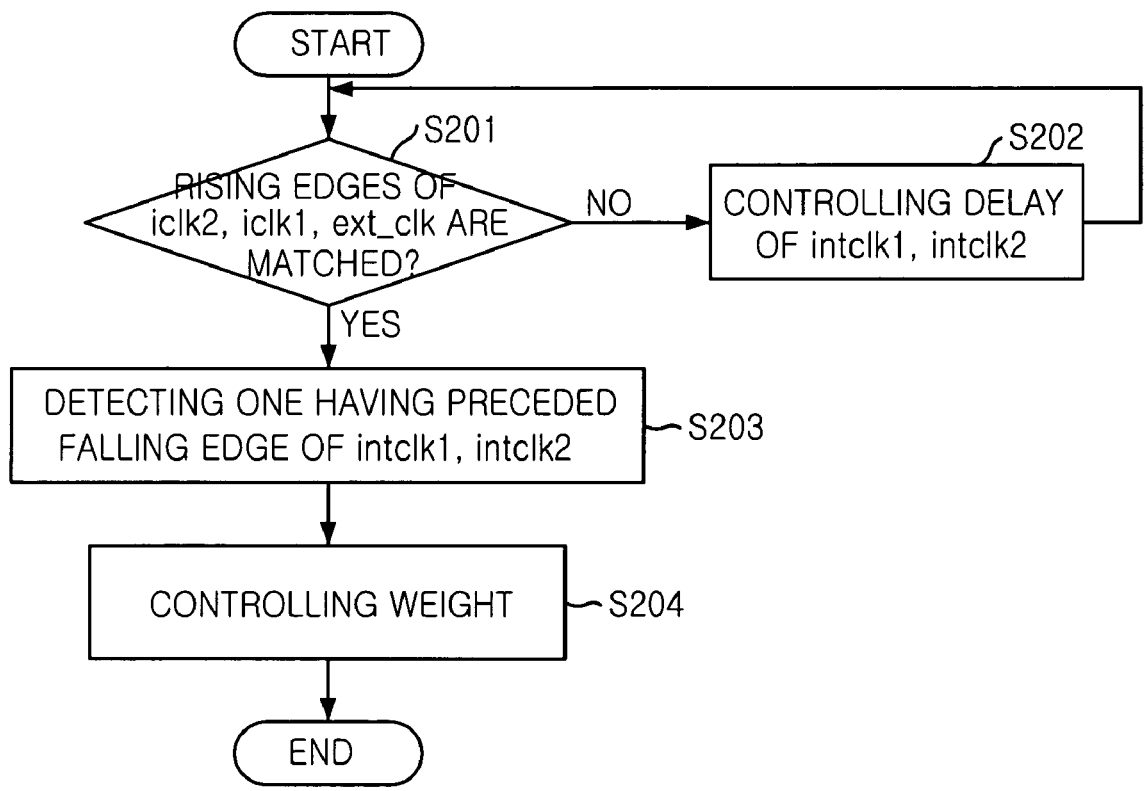
FIG. 2 is a flow chart showing an operation of a conventional DLL shown in FIG. 1.
Figure 3:
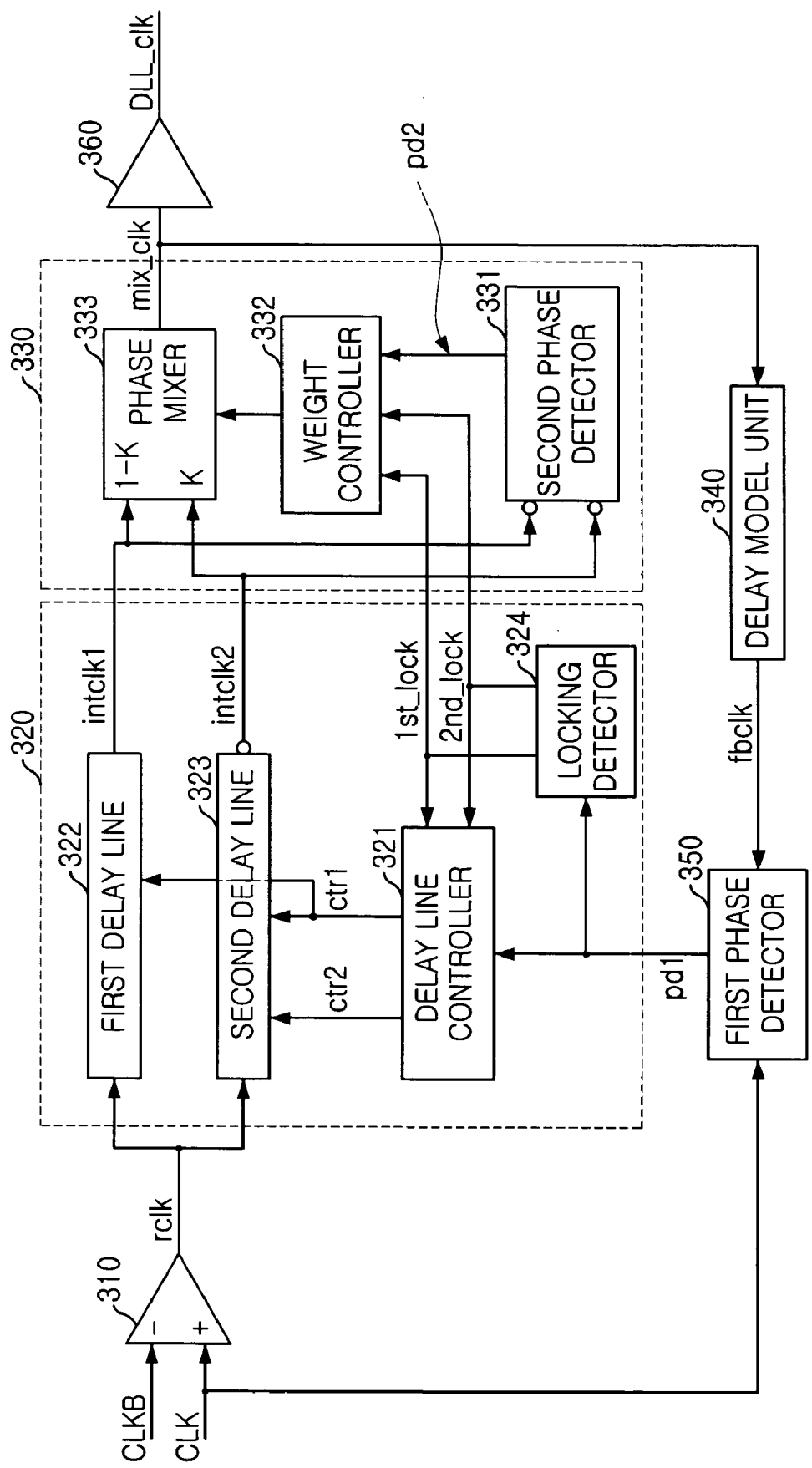
FIG. 3 is a block diagram showing a DLL in accordance with a first embodiment of the present invention.

FIG. 3 is a block diagram showing a DLL in accordance with a first embodiment of the present invention.

As shown, the DLL includes a first clock buffer 310, a second clock buffer 360, a delay line unit 320, a duty error control unit 330, a delay model unit 340 and a first phase detector 350.

The first clock buffer 310 receives an external clock signal CLK and its inverted signal, namely an external clock bar signal CLKB to output a rising edge clock signal rclk by buffering the external clock signal CLK and the external clock bar signal CLKB.

The delay line unit 320 receives the rising edge clock signal rclk and a first comparison signal pd1 to output a first delayed internal clock signal intclk1, a second delayed internal clock signal intclk2, a first delay locking signal 1st_lock and a second delay locking signal 2nd_lock.

The delay line unit 320 includes a first delay line 322, a second delay line 323, a delay line controller 321 and a locking detector 324.

The delay line controller 321 receives the first comparison signal pd1, the first and the second delay locking signals 1st_lock and 2nd_lock in order to generate a first delay line control signal ctr1 and a second delay line control signal ctr2. Herein, the first and the second delay line control signals ctr1 and ctr2 are respectively used for controlling the delay amounts of the first and the second delay lines 322 and 323.

The first delay line 322 receives the rising edge clock signal rclk in order to generate the first delayed internal clock signal intclk1 by delaying the rising edge clock signal rclk for a predetermined delay time according to the first delay line control signal ctr1.

Likewise, the second delay line 323 receives the rising edge clock signal rclk in order to delay the rising edge clock signal rclk for a predetermined delay time according to the second delay line control signal ctr2, and, then, inverts the delayed rising edge clock signal to generate the second delayed internal clock signal intclk2.

The locking detector 324 receives the first comparison signal pd1 to determined whether or not the first and the second delayed internal clock signals intclk1 and intclk2 are delay locked for generating the first and the second delay locking signals 1st_lock and 2nd_lock.

The duty error control unit 330 receives the first and the second delayed internal clock signals intclk1 and intclk2, the first and the second delay locking signals 1st_lock and 2nd_lock from the delay line unit 320 in order to generate a mixed clock signal mix_clk by mixing phases of the first and the second internal clock signals intclk1 and intclk2. Herein, the duty error control unit 330 compares a phase of the first delayed internal clock signal intclk1 to that of the second delayed internal clock signal intclk2 and applies a first weight 1−K and a second weight K to the first and the second delayed internal clock signals intclk1 and intclk2 respectively based on the comparison result in order to correct duty ratios of the first and the second delayed internal clock signals intclk1 and intclk2.

Herein, the second weight K is equal to or greater than 0 and is equal to or smaller than 1. The first weight 1−K is obtained by subtracting the second weight K from 1.

The duty error control unit 330 includes a phase mixer 333, a weight controller 332 and a second phase detector 331.

The second phase detector 331 receives inverted signals of the first and the second delayed internal clock signals intclk1 and intclk2 and determines which one of falling edges of the first and the second delayed internal clock signals intclk1 and intclk2 leads the other in order to generate a second comparison signal pd2.

The weight controller 332 controls the first and the second weights 1−K and K based on the first and the second delay locking signals 1st_lock and 2nd_lock and the second comparison signal pd2.

The delay model unit 340 receives the mixed clock signal mix_clk from the duty error control unit 330 and delays the mixed clock signal mix_clk for a predetermined delay time in order to output the delayed signal as a feed-backed clock signal fbclk. Herein, the predetermined delay time of the delay model unit 340 is equal to a delay time taken while the external clock signal CLK is passed through the DLL.

The first phase detector 350 receives the external clock signal CLK and the feed-backed clock signal fbclk and compares phases of the external clock signal CLK and the feed-backed clock signal fbclk to generate the first comparison signal pd1.

The second clock buffer 360 receives and buffers the mixed clock signal mix_clk in order to output the buffered signal as a delay locked clock signal DLL_clk.

Figure 4:
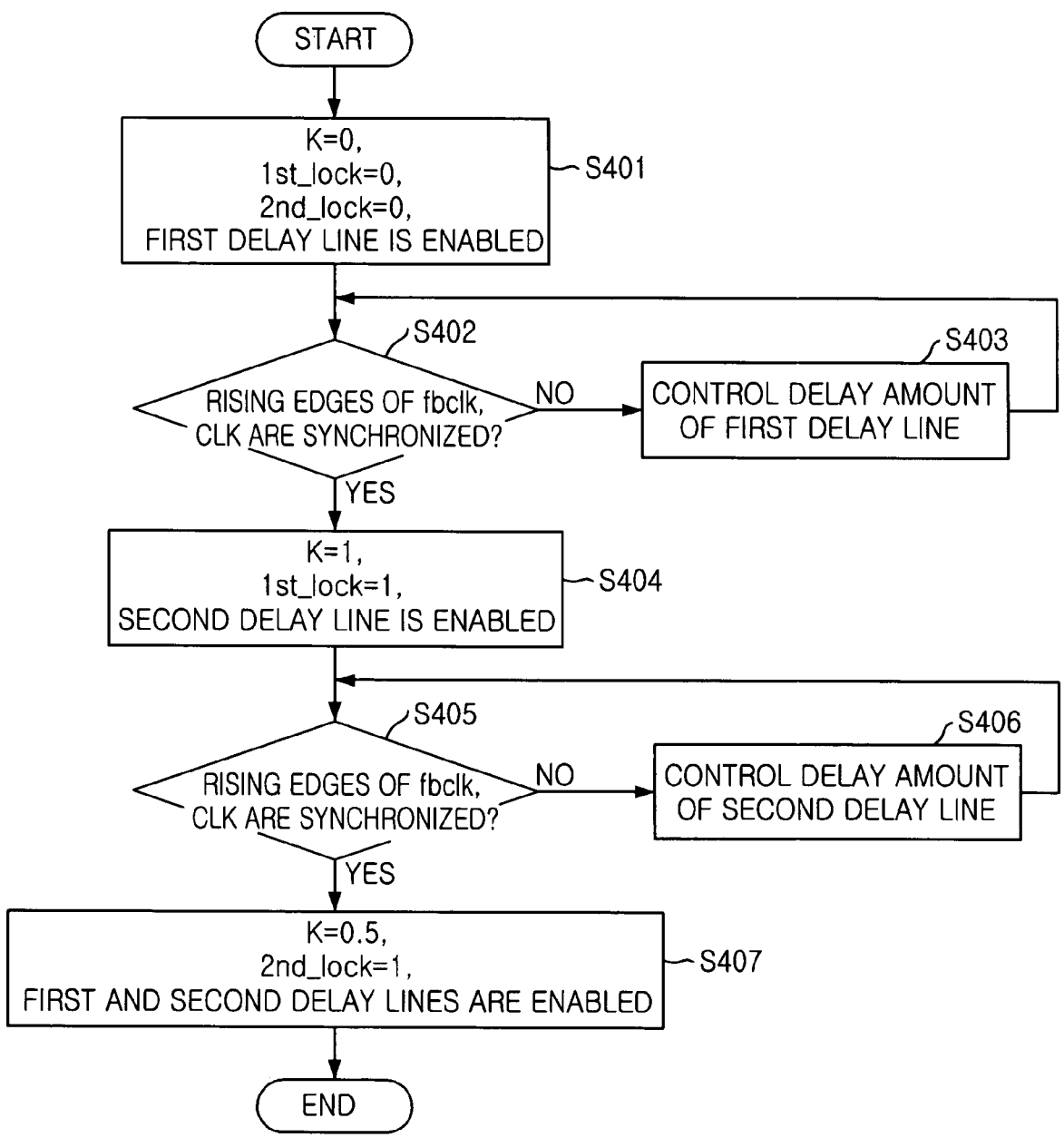
FIG. 4 is a flow chart showing an operation of a DLL shown in FIG. 3.

FIG. 4 is a flow chart showing an operation for delay locking the first and the second delayed internal clock signals intclk1 and intclk2 of the DLL shown in FIG. 3.

When the DLL is initialized, both of the first and the second delay locking signals 1st_lock and 2nd_lock are in a logic low level, and the weight controller 332 sets the second weight K to 0 at a step S401. Since the second weight K is 0, the phase mixer 333 receives only the first delayed internal clock signal intclk1 in order to output the received signal as the mixed clock signal mix_clk. At this time, the delay line controller 321 controls only the first delay line 322.

Next, the first phase detector 350 compares phases of the external clock signal CLK and the feed-backed clock signal fbclk in order to determine whether or not rising edges of the external clock signal CLK and the feed-backed clock signal fbclk are synchronized at a step S402.

If the rising edges of the external clock signal CLK and the feed-backed clock signal fbclk are not synchronized, a delay amount of the first delay line 322 is adjusted by the delay line controller 321 until the rising edges of the external clock signal CLK and the feed-backed clock signal fbclk are synchronized at a step S403.

Next, if the rising edges of the external clock signal CLK and the feed-backed clock signal fbclk are synchronized, i.e., if the first delay line 322 is delay locked which means that a rising edge of the first delayed internal clock signal intclk1 is synchronized with that of the external clock signal CLK, the locking detector 324 sets the first delay locking signal 1st_lock as a logic high level, and the weight controller 332 sets the second weight to 1, and the delay line controller 321 controls only the second delay line 323 at a step S404.

Thereafter, the second delayed internal clock signal intclk2 is outputted as the mixed clock signal mix_clk by the phase mixer 333. Then, the mixed clock signal mix_clk is inputted to the delay model unit 340 to be outputted as the feed-backed clock signal fbclk, and the first phase detector 350 compares rising edges of the external clock signal CLK and the feed-backed clock signal fbclk at a step S405.

If the rising edges of the external clock signal CLK and the feed-backed clock signal fbclk are not synchronized, a delay amount of the second delay line 323 is adjusted by the delay line controller 321 at a step S406.

Thereafter, if the rising edges of the external clock signal CLK and the feed-backed clock signal fbclk are synchronized, the locking detector 324 sets the second delay locking signal 2nd_lock to a logic high level, and both of the first and the second delay lines 322 and 323 are enabled at a step S407.

Then, since each rising edge of the first and the second delayed internal clock signals intclk1 and intclk2 are synchronized with a rising edge of the external clock signal CLK, rising edges of the first and the second delayed internal clock signals intclk1 and intclk2 are synchronized.

Figure 5:
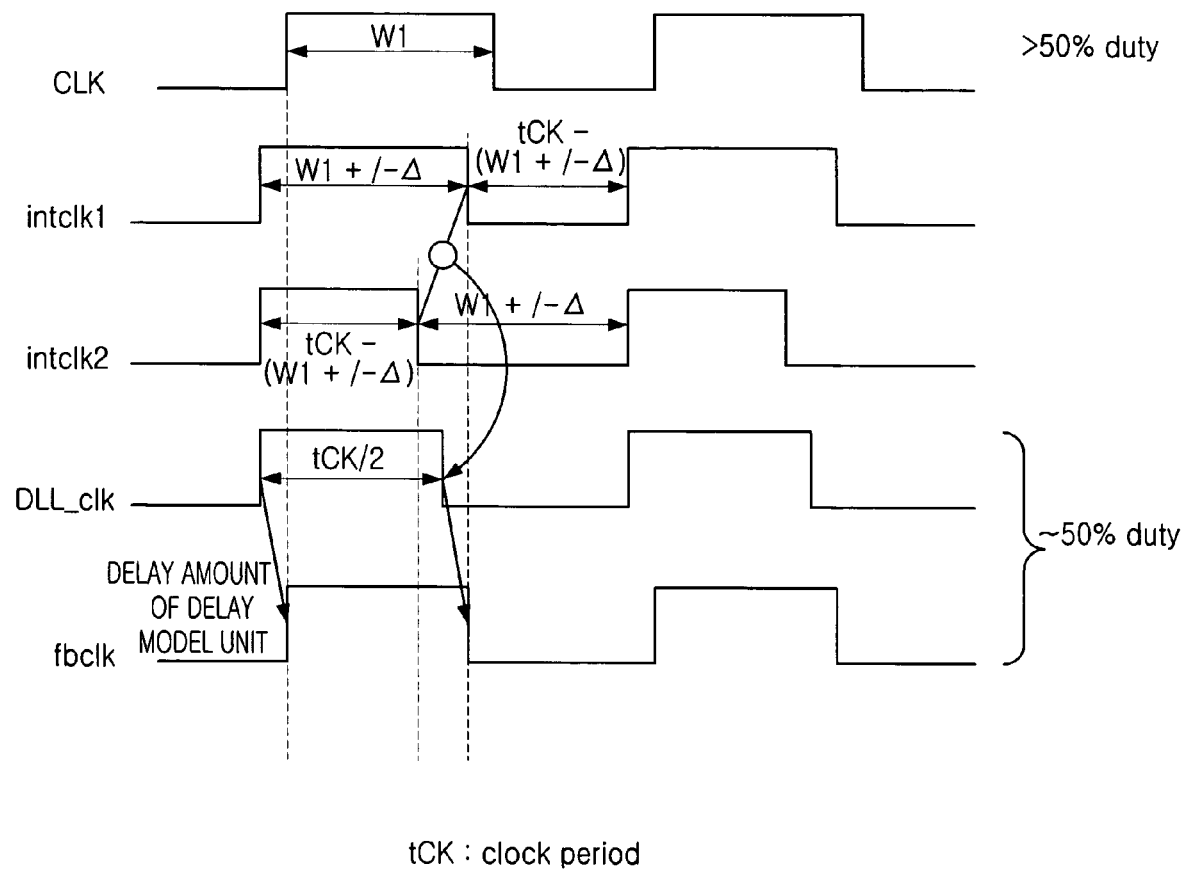
FIG. 5 is a waveform diagram showing an operation of a DLL shown in FIG. 3.

FIG. 5 is a waveform diagram showing a duty correction operation which is performed after delay locking the first and the second delayed internal clock signals intclk1 and intclk2.

The delay line controller 321 controls both of the first and the second delay lines 322 and 323, and the weight controller 332 determines the second weight K based on the second comparison signal pd2, the first delay locking signal 1st_lock and the second delay locking signal 2nd_lock.

The second phase detector 331 determines which one of two falling edges of the first and the second delayed internal clock signals intclk1 and intclk2 leads the other. If a falling edge of the first delayed internal clock signal intclk1 leads that of the second internal clock signal intclk2, the second comparison signal becomes in a logic high level. On the other hand, if a falling edge of the second internal clock signal intclk2 leads that of the first internal clock signal intclk1, the second comparison signal pd2 becomes in a logic low level.

When both of the first and the second delay locking signals 1st_lock and 2nd_lock are in a logic high level, the weight controller 332 finally determines the second weight K based on the second comparison signal pd2.

Herein, when both of the first and the second delay locking signals 1st_lock and 2nd_lock are in a logic high level, i.e., when the first and the second delayed internal clock signals intclk1 and intclk2 are delay-locked, rising edges of the first and the second delayed internal clock signals intclk1 and intclk2 are synchronized, but their falling edges are not synchronized having a time difference of a duty error that the external clock signal CLK has.

Thereafter, the phase mixer 333 performs a phase mixing operation on the first and the second delayed internal clock signals intclk1 and intclk2 to generate the mixed clock signal mix_clk. Since rising edges of the first and the second delayed internal clock signals intclk1 and intclk2 are synchronized, a rising edge of the mixed clock signal mix_clk is synchronized with rising edges of the first and the second internal clock signals intclk1 and intclk2.

However, falling edges of the first and the second delayed internal clock signals intclk1 and intclk2 are not synchronized. Therefore, for the mixed clock signal mix clk to have 50% of duty ratio, a middle phase between falling edges of the first and the second internal clock signals intclk1 and intclk2 should be found by performing the phase mixing operation. The symbol Δ shown in FIG. 5 is a duty variation which can be generated while the external clock signal CLK is passed through the first and the second delay lines 322 and 323.

Generally, to find a middle phase between rising edges or falling edges of two signals, a phase mixer applies a greater weight to one of the two signals which has a leading phase.

That is, when both of the first and the second delay locking signals 1st_lock and 2nd_lock are in a logic high level, the weight controller 332 applies a greater weight to one of the first and the second delayed internal clock signals intclk1 and intclk2 who has a leading phase in response to the second comparison signal pd2.

Figure 6:
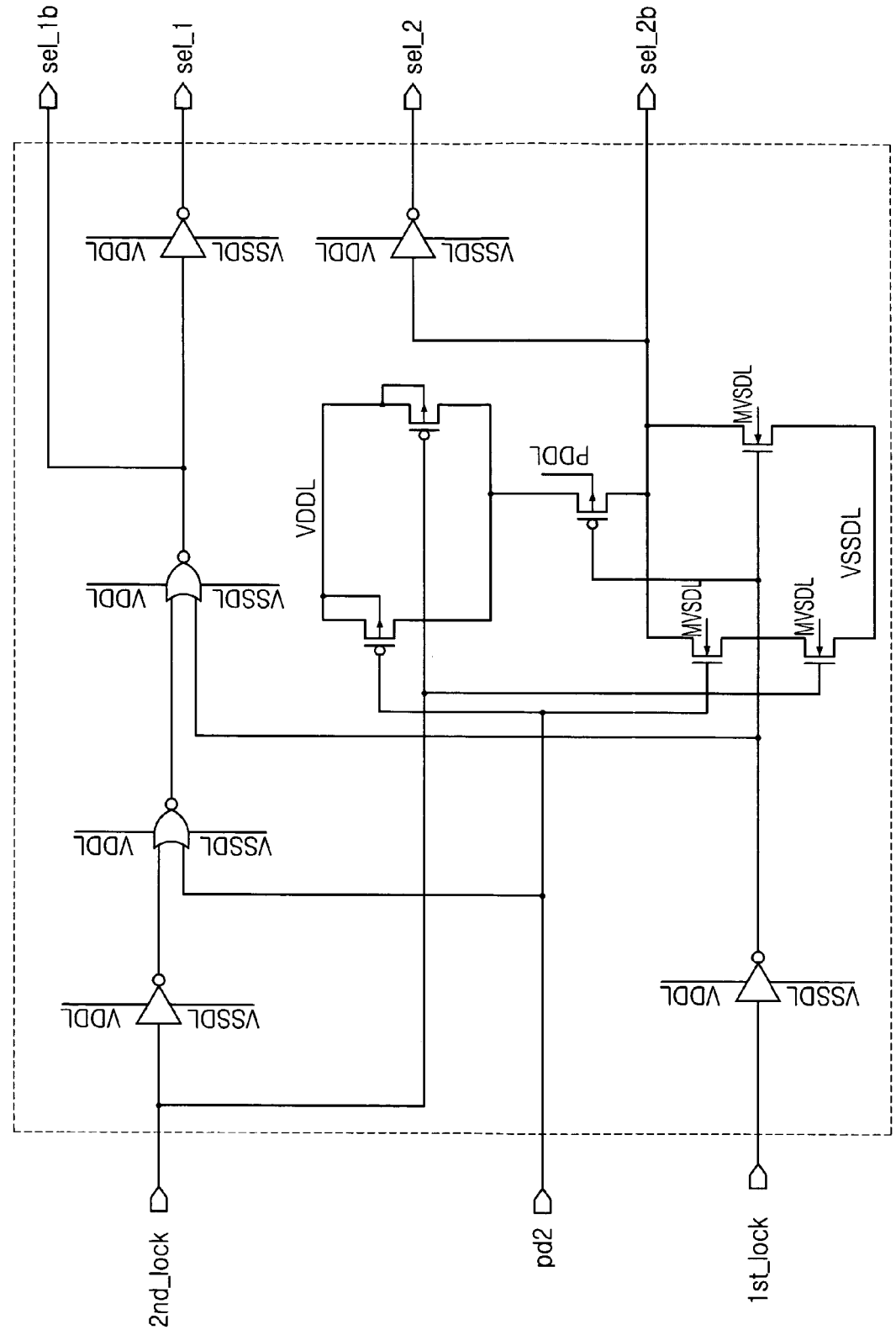
FIG. 6 is a schematic circuit diagram showing a weight controller shown in FIG. 3.

FIG. 6 is a schematic circuit diagram showing the weight controller 332.

As shown, the weight controller 332 receives the second comparison signal pd2, the first delay locking signal 1st_lock and the second delay locking signal 2nd_lock to generate a first selection signal sel_1, a second selection signal sel_2, a first selection bar signal sel_1b and a second selection bar signal sel_2b. Herein, logic states of the first and the second selection signals sel_1 and sel_2 and the first and the second selection bar signals sel_1b and sel_2b are determined according to logic states of the second comparison signal pd2, the first and the second delay locking signals 1st_lock and 2nd_lock.

The second weight K is determined by logic states of the first and the second selection signals sel_1 and sel_2 and the first and the second selection bar signals sel_1b and sel_2b.

For example, if the first and the second selection signals sel_1 and sel_2 are in a logic high level, and the first and the second selection bar signals sel_1b and sel_2b are in a logic low level, the second weight K is set to 0.

An operation of the weight controller 332 is described below referring to FIGS. 3 to 7.

In a first case I, at an initial state, when the first and the second delay locking signals 1st_lock and 2nd_lock are in a logic low level, the first and the second selection signals sel_1 and sel_2 are in a logic high level, and the first and the second selection bar signals sel_1b and sel_2b are in a logic low level. In this case, the weight controller 332 sets the weight value K to 0 according to logic states of the first and the second selection signals sel_1 and sel_2, and the first and the second selection bar signals sel_1b and sel_2b.

In a second case II, when the first delay locking signal 1st_lock is in a logic high level and the second delay locking signal 2nd_lock is in a logic low level, the first and the second selection signals sel_1 and sel_2 are in a logic low level, and the first and the second selection bar signals sel_1b and sel_2b are in a logic high level. In this case, the weight controller 332 sets the weight value K to 1 according to logic states of the first and the second selection signals sel_1 and sel_2, and the first and the second selection bar signals sel_1b and sel_2b.

In a third case III, when both of the first and the second delay locking signals 1st_lock and 2nd_lock are in a logic high level, i.e., when rising edges of the first and the second internal clock signals intclk1 and intclk2 are synchronized, the weight value K is determined by a logic state of the second comparison signal pd2.

In this case, if the second comparison signal pd2 is in a logic high level, i.e., if a falling edge of the first internal clock signal intclk1 leads a falling edge of the second internal clock signal intclk2, the first selection signal sel_1 and the second selection bar signal sel_2b are in a logic low level, and the second selection signal sel_2 and the first selection bar signal sel_1b are in a logic high level. As a result, the weight controller 332 sets the weight value K to ⅓ according to logic state of the first and the second selection signal sel_1 and sel_2, and the first and the second selection bar signal sel_1b and sel_2b.

On the other hand, if the second comparison signal pd2 is in a logic low level, i.e., if a falling edge of the first internal clock signal intclk1 lags behind a falling edge of the second internal clock signal intclk2, the first selection signal sel_1 and the second selection bar signal sel_2b are in a logic high level, and the second selection signal sel_2 and the first selection bar signal sel_1b are in a logic low level. As a result, the weight controller 332 sets the weight value K to ⅔ according to logic state of the first and the second selection signal sel_1 and sel_2, and the first and the second selection bar signal sel_1b and sel_2b.

Table. 1 briefly shows the operation of the weight controller 332 described above.

TABLE 1

|  | 1st_lock | 2nd_lock | pd2 | sel_1 | sel_2 | sel_1b | sel_2b | K |
|---|---|---|---|---|---|---|---|---|
| I | low | low |  | high | high | low | low | 0 |
| II | high | low |  | low | low | high | high | 1 |
| III | high | high | high | low | high | high | low | ⅓ |
|  | high | high | low | high | low | low | high | ⅔ |

Figure 7:
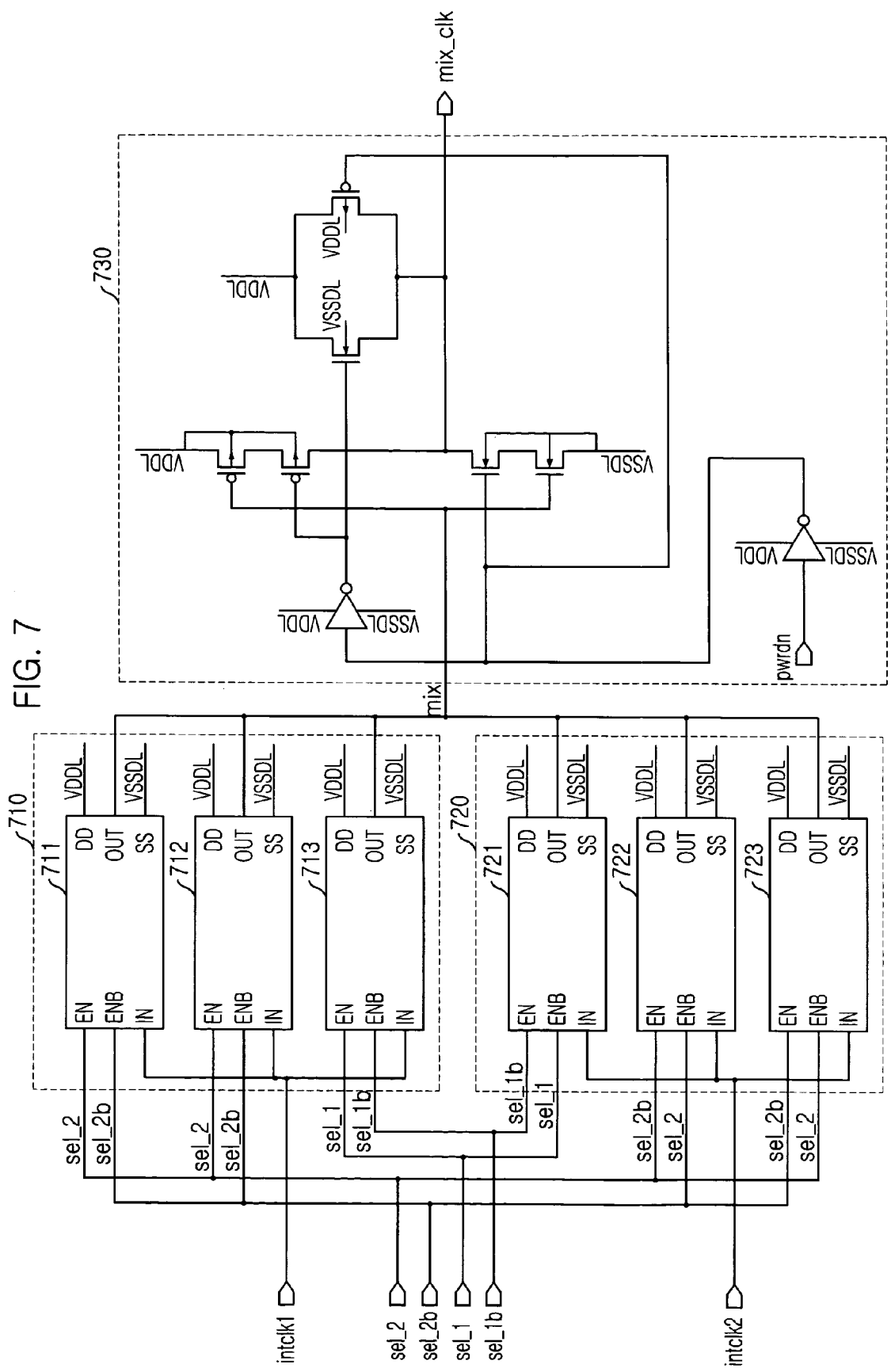
FIG. 7 is a schematic circuit diagram showing a phase mixer shown in FIG. 3.

FIG. 7 is a schematic circuit diagram showing the phase mixer 333 shown in FIG. 3.

As shown, the phase mixer 333 includes a first phase selector 710, a second phase selector 720 and an output controller 730.

The first and the second internal clock signals intclk1 and intclk2 are respectively inputted to the first and the second phase selectors 710 and 720. Each of the first and the second phase selectors 710 and 720 includes a plurality of unit phase mixers 711 to 713 and 721 to 723. Herein, the number of unit phase mixers included in each of the first and the second phase selectors 710 and 720 can be larger than three to adjust the weight value K more minutely.

Each of the unit phase mixers 711, 712, 722 and 723 receives the second selection signal sel_2 and the second selection bar signal sel_2b; and each of the unit phase mixers 713 and 721 receives the first selection signal sel_1 and the first selection bar signal sel_1b.

When rising edges of the first and the second internal clock signals intclk1 and intclk2 are synchronized, and a falling edge of the first internal clock signal intclk1 lags behind that of the second internal clock signal intclk2, the first selection signal sel_1 and the second selection bar signal sel_2b are in a logic high level, and the first selection bar signal sel_1b and the second selection signal sel_2 are in a logic low level. Therefore, the unit phase mixers 713, 722 and 723 are enabled. At this time, the enabled unit phase mixers 713, 722 and 723 are operated as inverters, then, a weight of ⅓ is applied to the first internal clock signal intclk1 and a weight of ⅔ is applied to the second internal clock signal intclk2.

That is, since a falling edge of the second internal clock signal intclk2 leads that of the first internal clock signal intclk1, more unit phase mixers of the second phase selector 720 are enabled than that of the first phase selector 710 in order to apply a more weight to the second internal clock signal intclk2 than to the first clock signal intclk1. Therefore, a middle phase between falling edges of the first and the second internal clock signals intclk1 and intclk2 can be found.

Meanwhile, a weight value close to 0.5 can be generated by controlling size of a transistor included in each of the unit phase mixers 711 to 713 and 721 to 723.

The output controller 730 does not output the mixed clock signal mix_clk based on a power down mode signal pwrdn when the semiconductor memory device is in power down mode in order to reduce power consumption. Herein, the power down mode signal pwrdn is activated as a logic high level when the semiconductor memory device is in the power down mode.

Figure 8:
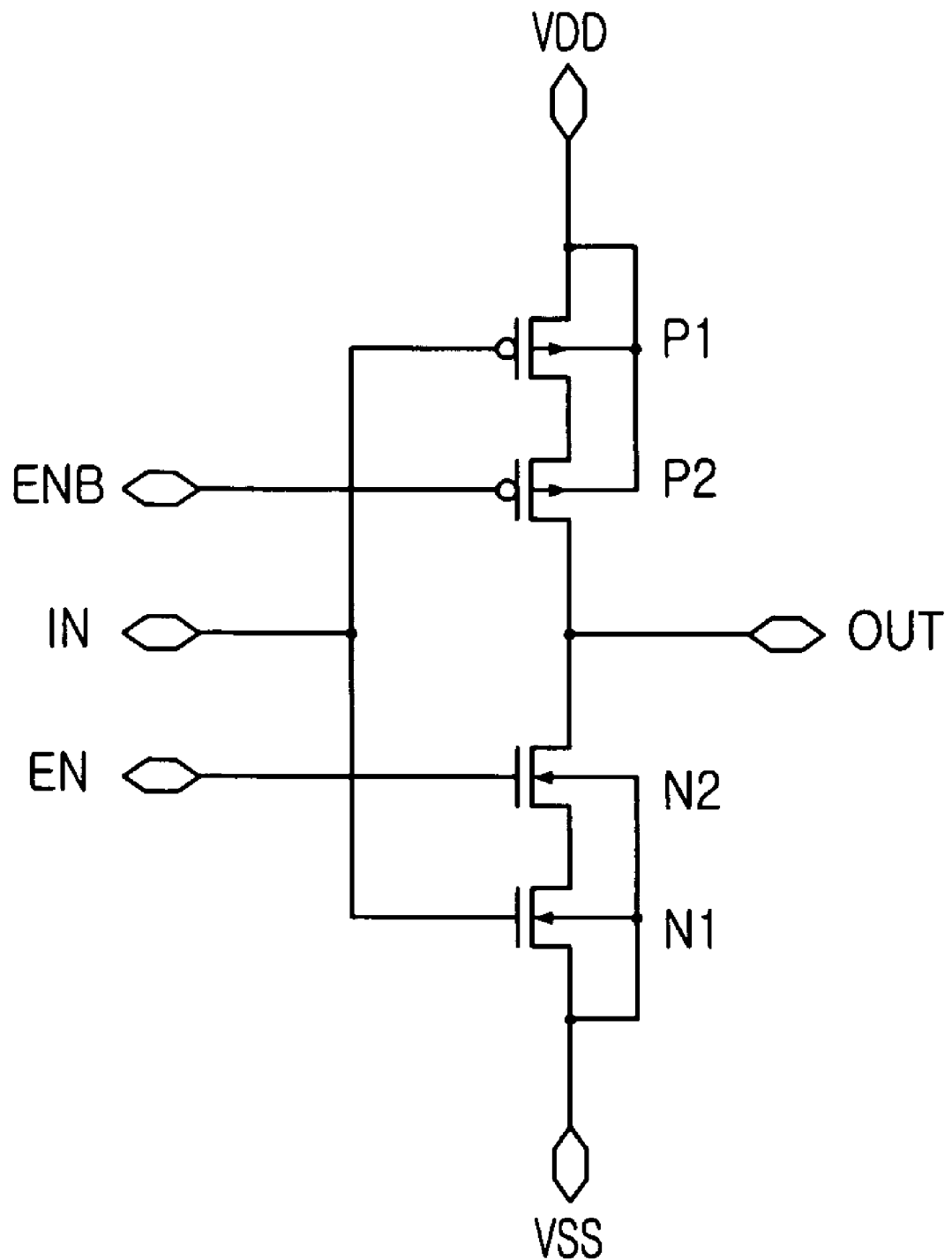
FIG. 8 is a schematic circuit diagram showing unit phase mixers shown in FIG. 7.

FIG. 8 is a schematic circuit diagram showing the unit phase mixers 711 to 713 and 721 to 723.

As shown, each of the unit phase mixers 711 to 713 and 721 to 723 includes a first and a second p-channel metal oxide semiconductor (PMOS) transistors P1 and P2, and also includes a first and a second n-channel metal oxide semiconductor (NMOS) transistors N1 and N2.

The first PMOS transistor P1 is connected between a power supply voltage VDD and the second PMOS transistor P2, and a gate of the first PMOS transistor P1 receives one of the first and the second internal clock signals intclk1 and intclk2.

The second PMOS transistor P2 is connected between the first PMOS transistor P1 and the second NMOS transistor N2, and a gate of the second PMOS transistor P2 receives one of the first and the second selection signals sel_1 and sel_2 and the first and the second selection bar signals sel_1b and sel_2b.

The first NMOS transistor N1 is connected between the second NMOS transistor N2 and a ground voltage VSS, and a gate of the first NMOS transistor N1 receives one of the first and the second internal clock signals intclk1 and intclk2.

The second NMOS transistor N2 is connected between the second PMOS transistor P2 and the first NMOS transistor N1, and a gate of the second NMOS transistor N2 receives one of the first and the second selection signals sel_1 and sel_2 and the first and the second selection bar signals sel_1b and sel_2b.

Figure 9:
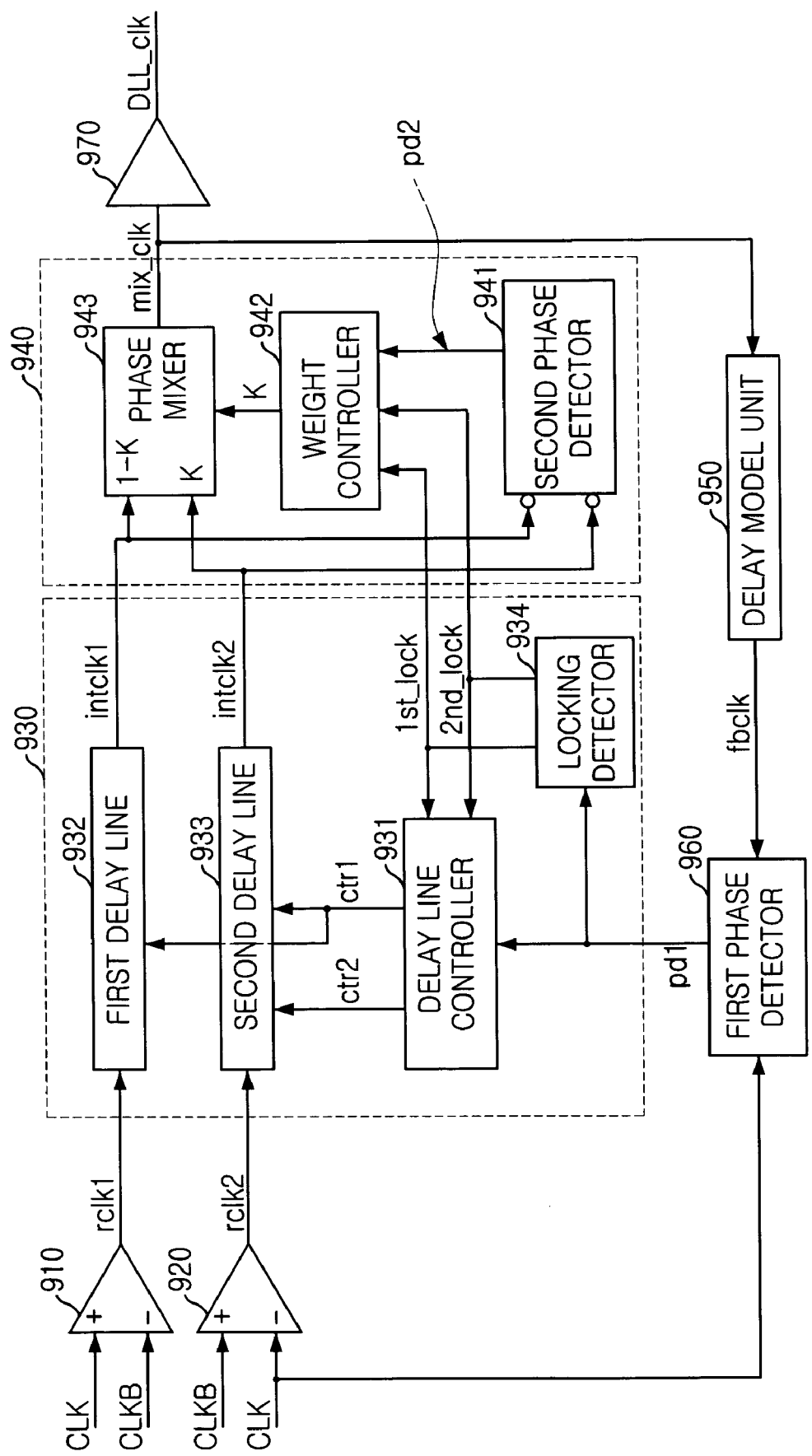
FIG. 9 is a block diagram showing a DLL in accordance with a second embodiment of the present invention.

FIG. 9 is a block diagram showing a DLL in accordance with a second embodiment of the present invention.

As shown, the DLL includes a first clock buffer 910, a second clock buffer 920, a third clock buffer 970, a delay line unit 930, a duty error control unit 940, a delay model unit 950 and a first phase detector 960.

The first clock buffer 910 receives an external clock signal CLK through a non-inverting terminal and its inverted signal, namely an external clock bar signal CLKB through an inverting terminal in order to output a first rising edge clock signal rclk1 by buffering the external clock signal CLK and the external clock bar signal CLKB.

The second clock buffer 920 receives an external clock signal CLK through an inverting terminal and the external clock bar signal CLKB through a non-inverting terminal in order to output a second rising edge clock signal rclk2 by buffering the external clock signal CLK and the external clock bar signal CLKB.

The delay line unit 930 receives the first and the second rising edge clock signals rclk1 and rclk2 and a first comparison signal pd1 in order to output a first delayed internal clock signal intclk1, a second delayed internal clock signal intclk2, a first delay locking signal 1st_lock and a second delay locking signal 2nd_lock.

The delay line unit 930 includes a first delay line 932, a second delay line 933, a delay line controller 931 and a locking detector 934.

The delay line controller 931 receives the first comparison signal pd1, the first and the second delay locking signals 1st_lock and 2nd_lock in order to generate a first delay line control signal ctr1 and a second delay line control signal ctr2. Herein, the first and the second delay line control signals ctr1 and ctr2 are respectively used for controlling the delay amounts of the first and the second delay lines 932 and 933.

The first delay line 932 receives the first rising edge clock signal rclk1 in order to generate the first delayed internal clock signal intclk1 by delaying the first rising edge clock signal rclk1 for a predetermined delay time according to the first delay line control signal ctr1.

Likewise, the second delay line 933 receives the second rising edge clock signal rclk2 in order to delay the rising edge clock signal rclk2 for a predetermined delay time according to the second delay line control signal ctr2 in order to generate the second delayed internal clock signal intclk2.

The locking detector 934 receives the first comparison signal pd1 to determined whether or not the first and the second delayed internal clock signals intclk1 and intclk2 are delay locked for generating the first and the second delay locking signals 1st_lock and 2nd_lock.

The duty error control unit 940 receives the first and the second delayed internal clock signals intclk1 and intclk2, the first and the second delay locking signals 1st_lock and 2nd_lock from the delay line unit 930 in order to generate a mixed clock signal mix_clk by mixing phases of the first and the second internal clock signals intclk1 and intclk2. Herein, the duty error control unit 940 compares a phase of the first delayed internal clock signal intclk1 to that of the second delayed internal clock signal intclk2 and applies a first weight 1−K and a second weight K to the first and the second delayed internal clock signals intclk1 and intclk2 respectively based on the comparison result in order to correct duty ratios of the first and the second delayed internal clock signals intclk1 and intclk2.

Herein, the second weight K is equal to or greater than 0 and is equal to or smaller than 1. The first weight 1−K is obtained by subtracting the second weight K from 1.

The duty error control unit 940 includes a phase mixer 943, a weight controller 942 and a second phase detector 941.

The second phase detector 941 receives inverted signals of the first and the second delayed internal clock signals intclk1 and intclk2 and determines which one of falling edges of the first and the second delayed internal clock signals intclk1 and intclk2 leads the other in order to generate a second comparison signal pd2.

The weight controller 942 controls the first and the second weights 1−K and K based on the first and the second delay locking signals 1st_lock and 2nd_lock and the second comparison signal pd2.

The delay model unit 950 delays the mixed clock signal mix_clk for a predetermined delay time in order to output the delayed signal as a feed-backed clock signal fbclk. Herein, the predetermined delay time of the delay model unit 950 is equal to a delay time generated while the external clock signal CLK is passed through the DLL.

The first phase detector 960 receives the external clock signal CLK and the feed-backed clock signal fbclk and compares phases of the external clock signal CLK and the feed-backed clock signal fbclk to generate the first comparison signal pd1.

The third clock buffer 970 buffers the mixed clock signal mix_clk in order to output the buffered signal as a delay locked clock signal DLL_clk.

As described above, a structure and an operation of the DLL shown in FIG. 9 are the same as those of the DLL shown in FIG. 3 except that first and the second delay lines 932 and 933 respectively receive two different clock signals, i.e., the first and the second rising edge clock signals rclk1 and rclk2. In addition, since the second rising edge clock signal rclk2 is an inverted signal of the first rising edge clock signal rclk1, the second delay line 933 does not have an inverting unit at its output terminal, i.e., the second delay line 933 does not invert its output signal for generating the second delayed internal clock signal intclk2.

Figure 10:
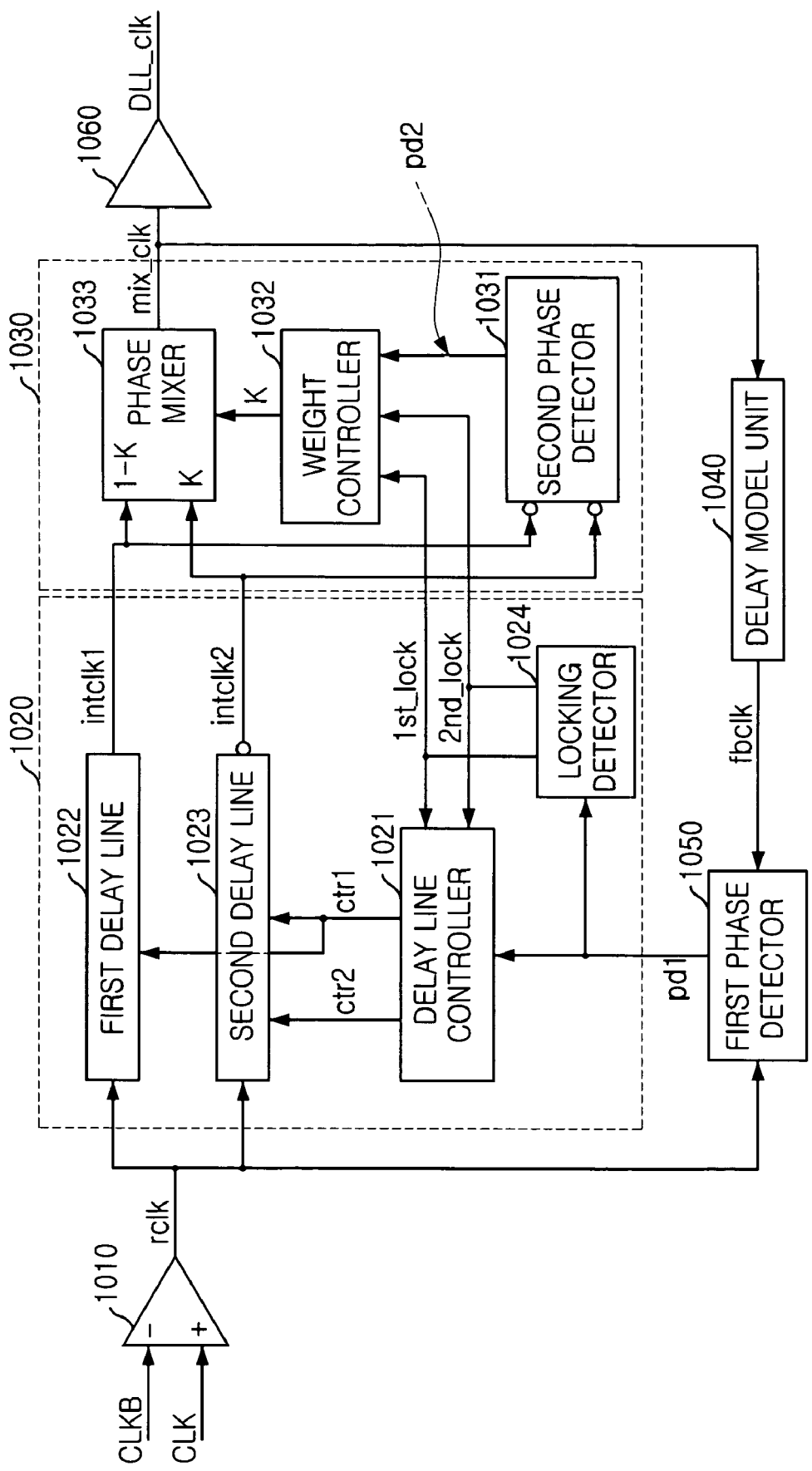
FIG. 10 is a block diagram showing a DLL in accordance with a third embodiment of the present invention.

FIG. 10 is a block diagram showing a DLL in accordance with a third embodiment of the present invention.

As shown, the DLL includes a first clock buffer 1010, a second clock buffer 1050, a delay line unit 1020, a duty error control unit 1030, a delay model unit 1040 and a first phase detector 1050.

The first clock buffer 1010 receives an external clock signal CLK and its inverted signal, namely an external clock bar signal CLKB to output a rising edge clock signal rclk by buffering the external clock signal CLK and the external clock bar signal CLKB.

The delay line unit 1020 receives the rising edge clock signal rclk and a first comparison signal pd1 in order to output a first delayed internal clock signal intclk1, a second delayed internal clock signal intclk2, a first delay locking signal 1st_lock and a second delay locking signal 2nd_lock.

The delay line unit 1020 includes a first delay line 1022, a second delay line 1023, a delay line controller 1021 and a locking detector 1024.

The delay line controller 1021 receives the first comparison signal pd1, the first and the second delay locking signals 1st_lock and 2nd_lock in order to generate a first delay line control signal ctr1 and a second delay line control signal ctr2. Herein, the first and the second delay line control signals ctr1 and ctr2 are respectively used for controlling the delay amounts of the first and the second delay lines 1022 and 1023.

The first delay line 1022 receives the rising edge clock signal rclk in order to generate the first delayed internal clock signal intclk1 by delaying the rising edge clock signal rclk for a predetermined delay time according to the first delay line control signal ctr1.

Likewise, the second delay line 1023 receives the rising edge clock signal rclk in order to delay the rising edge clock signal rclk for a predetermined delay time according to the second delay line control signal ctr2, and, then, inverts the delayed rising edge clock signal in order to generate the second delayed internal clock signal intclk2.

The locking detector 1024 receives the first comparison signal pd1 to determined whether or not the first and the second delayed internal clock signals intclk1 and intclk2 are delay locked for generating the first and the second delay locking signals 1st_lock and 2nd_lock.

The duty error control unit 1030 receives the first and the second delayed internal clock signals intclk1 and intclk2, the first and the second delay locking signals 1st_lock and 2nd_lock from the delay line unit 1020 in order to generate a mixed clock signal mix_clk by mixing phases of the first and the second internal clock signals intclk1 and intclk2. Herein, the duty error control unit 1030 compares a phase of the first delayed internal clock signal intclk1 to that of the second delayed internal clock signal intclk2 and applies a first weight 1−K and a second weight K to the first and the second delayed internal clock signals intclk1 and intclk2 respectively based on the comparison result in order to correct duty ratios of the first and the second delayed internal clock signals intclk1 and intclk2.

Herein, the second weight K is equal to or greater than 0 and is equal to or smaller than 1. The first weight 1−K is obtained by subtracting the second weight K from 1.

The duty error control unit 1030 includes a phase mixer 1033, a weight controller 1032 and a second phase detector 1031.

The second phase detector 1031 receives inverted signals of the first and the second delayed internal clock signals intclk1 and intclk2 and determines which one of falling edges of the first and the second delayed internal clock signals intclk1 and intclk2 leads the other in order to generate a second comparison signal pd2.

The weight controller 1032 controls the first and the second weights 1−K and K based on the first and the second delay locking signals 1st_lock and 2nd_lock and the second comparison signal pd2.

The delay model unit 1040 delays the mixed clock signal mix_clk for a predetermined delay time in order to output the delayed signal as a feed-backed clock signal fbclk. Herein, the predetermined delay time of the delay model unit 1040 is equal to a delay time generated while the external clock signal CLK is passed through the DLL.

The first phase detector 1050 receives the rising edge clock signal rclk and the feed-backed clock signal fbclk and compares phases of the rising edge clock signal rclk and the feed-backed clock signal fbclk to generate the first comparison signal pd1.

The second clock buffer 1060 buffers the mixed clock signal mix_clk in order to output the buffered signal as a delay locked clock signal DLL_clk.

As described above, a structure and an operation of the DLL shown in FIG. 10 are the same as those of the DLL shown in FIG. 3 except that the first phase detector 1050 receives the rising edge clock signal rclk instead of the external clock signal CLK. Therefore, a delay amount of the first clock buffer 1050 should be different from that of the first phase detector 350, and the delay amount of the first clock buffer 1050 is well known to those who skilled in the art.

As described above, the DLL in accordance with the present invention can be operated without using three blocks included in the conventional DLL, i.e., a phase mixer, a delay model unit and a phase detector. Therefore, the DLL in accordance with the present invention can reduce power consumption, and a size of the DLL can be decreased. As a result, the number of a net die can be increased.

In addition, since an external clock signal is passed through a single feed-back loop for generating a delay locked clock signal, an error due to a delay difference between two feed-back loops included in the conventional DLL is not occurred in the DLL in accordance with the present invention.

The present application contains subject matter related to Korean patent application No. 2003-75939, filed in the Korean Patent Office on Oct. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) capable of correcting a duty ratio of a clock signal comprising:
    a clock buffer which receives an external clock signal for outputting a rising edge clock signal;
    a delay means for delaying the rising edge clock signal based on a first comparison signal in order to generate a first internal clock signal, a second internal clock signal, a first delay locking signal and a second delay locking signal;
    a duty correction means for receiving the first and the second internal clock signals and the first and the second delay locking signals and generating a delay locked clock signal by correcting a duty cycle of the external clock signal; and
    a clock feed-back unit for receiving the delay locked clock signal and the external clock signal in order to generate the first comparison signal.

2. The DLL as recited in claim 1, wherein the clock feed-back unit includes:
    a delay model unit which delays the delay locked clock signal for a predetermined delay time to generate a feed-backed clock signal; and
    a first phase detector which receives the external clock signal and the feed-backed clock signal to generate the first Comparison signal comparing phases of the external clock signal and the feed-backed clock signal.

3. The DLL as recited in claim 2, wherein the delay means includes:
    a delay line controller which receives the first comparison signal and the first and the second delay locking signals to generate a first delay line control signal and a second delay line control signal;
    a first delay line which delays the rising edge clock signal based on the first delay line control signal in order to generate the first internal clock signal;
    a second delay line which delays the rising edge clock signal based on the second delay line control signal and inverts the delayed rising edge clock signal in order to generate the second internal clock signal; and a locking detector which receives the first comparison signal and determines whether or not the first and the second delay lines are delay locked based on the first comparison signal in order to generate the first and the second delay locking signal.

4. The DLL as recited in claim 3, wherein the duty correction means includes:

a second phase detector which receives inverted signals of the first and the second internal clock signals and determines which one of falling edges of the received signals leads the other in order to generate a second comparison signal;

a weight controller which receives the second comparison signal and the first and the second delay locking signals in order to generate a weight value; and a phase mixer which receives the first and the second internal clock signals to generate the delay locked clock signal by mixing phases applying the weight value to the second internal clock signal and a second weight value to the first internal clock signal, wherein the second weight value is a value of subtracting the weight value from 1.

5. The DLL as recited in claim 4, wherein the weight value includes a first selection signal, a second selection signal, a first selection bar signal and a second selection bar signal.

6. The DLL as recited in claim 5, wherein the weight value is determined based on logic states of the first selection signal, the second selection signal, the first selection bar signal, the second selection bar signal and the second comparison signal.

7. The DLL as recited in claim 6, wherein the phase mixer includes:

a first phase selector for correcting a phase of the first internal clock signal based on the first and the second selection signals and the first and the second selection bar signals; and a second phase selector for correcting a phase of the second internal clock signal based on the first and the second selection signals and the first and the second selection bar signals.

8. The DLL as recited in claim 7, wherein the first phase selector includes a plurality of unit phase mixers each of which receives the first and the second selection signals or the first and the second selection bar signals.

9. The DLL as recited in claim 8, wherein each of the plurality of unit phase mixers includes:

a first PMOS transistor whose source and gate are respectively connected to a power supply voltage and one of the first and the second internal clock signals;

a second PMOS transistor whose source and gate are respectively connected to a drain of the first PMOS transistor and one of the first and the second selection signals and the first and the second selection bar signals;

a first NMOS transistor whose source and gate are respectively connected to a ground and one of the first and the second internal clock signals; and a second NMOS transistor whose drain and gate are respectively connected to a grain of the second PMOS transistor and one of the first and the second selection signals and the first and the second selection bar signals.

10. A delay locked loop (DLL) capable of correcting a duty ratio of a clock signal comprising:

a clock buffer which receives an external clock signal for outputting a rising edge clock signal;

a delay means for delaying the rising edge clock signal based on a first comparison signal in order to generate a first internal clock signal, a second internal clock signal, a first delay locking signal and a second delay locking signal;

a duty correction means for receiving the first and the second internal clock signals and the first and the second delay locking signals and generating a delay locked clock signal by correcting a duty cycle of the external clock signal; and a clock feed-back unit for receiving the delay locked clock signal and the rising edge clock signal in order to generate the first comparison signal.

11. The DLL as recited in claim 10, wherein the clock feed-back unit includes:

a delay model unit which delays the delay locked clock signal for a predetermined delay time to generate a feed-backed clock signal; and a first phase detector which receives the rising edge clock signal and the feed-backed clock signal to generate the first comparison signal by comparing phases of the rising edge clock signal and the feed-backed clock signal.

12. The DLL as recited in claim 11, wherein the delay means includes:

a delay line controller which receives the first comparison signal and the first and these cond delay locking signals to generate a first delay line control signal and a second delay line control signal;

a first delay line which delays the rising edge clock signal based on the first delay line control signal in order to generate the first internal clock signal;

a second delay line which delays the rising edge clock signal based on the second delay line control signal and inverts the delayed rising edge clock signal in order to generate the second internal clock signal; and a locking detector which receives the first comparison signal and determines whether or not the first and the second delay lines are delay locked based on the first comparison signal in order to generate the first and the second delay locking signal.

13. The DLL as recited in claim 12, wherein the duty correction means includes:

a second phase detector which receives inverted signals of the first and the second internal clock signals and determines which one of falling edges of the received signals leads the other in order to generate a second comparison signal;

weight controller which receives the second comparison signal and the first and the second delay locking signals in order to generate a weight value; and a phase mixer which receives the first and the second internal clock signals to generate the delay locked clock signal by mixing phases applying the weight value to the second internal clock signal and a second weight value to the first internal clock signal, wherein the second weight value is a value of subtracting the weight value from 1.

14. The DLL as recited in claim 13, wherein the weight value includes a first selection signal, a second selection signal, a first selection bar signal and a second selection bar signal.

15. The DLL as recited in claim 14, wherein the weight value is determined based on logic states of the first selection signal, the second selection signal, the first selection bar signal, the second selection bar signal and the second comparison signal.

16. The DLL as recited in claim 15, wherein the phase mixer includes:
a first phase selector for correcting a phase of the first internal clock signal based on the first and the second selection signals and the first and the second selection bar signals; and
a second phase selector for correcting a phase of the second internal clock signal based on the first and the second selection signals and the first and the second selection bar signals.

17. The DLL as recited in claim 16, wherein the first phase selector includes a plurality of unit phase mixers each of which receives the first and the second selection signals or the first and the second selection bar signals.

18. The DLL as recited in claim 17, wherein each of the plurality of unit phase mixers includes:
a first PMOS transistor whose source and gate are respectively connected to a power supply voltage and one of the first and the second internal clock signals;
a second PMOS transistor whose source and gate are respectively connected to a drain of the first PMOS transistor and one of the first and the second selection signals and the first and the second selection bar signals;
a first NMOS transistor whose source and gate are respectively connected to a ground and one of the first and the second internal clock signals; and
a second NMOS transistor whose drain and gate are respectively connected a grain of the second PMOS transistor and one of the first and the second selection signals and the first and the second selection bar signals.

19. A delay locked loop (DLL) capable of correcting duty ratio of a clock signal comprising:
a first clock buffer which receives an external clock signal for outputting a first rising edge clock signal;
a second clock buffer which receives the external clock signal for outputting a second rising edge clock signal;
a delay means for delaying the first and second rising edge clock signal based on a first comparison signal in order to generate a first internal clock signal, a second internal clock signal, a first delay locking signal and a second delay locking signal;
a duty correction means for receiving the first and the second internal clock signals and the first and the second delay locking signals and generating a delay locked clock signal by correcting a duty cycle of the external clock signal; and
a clock feed-back unit which receives the delay locked clock signal and the external clock signal in order to generate the first comparison signal.

20. The DLL as recited in claim 19, wherein the second 20 rising edge clock signal is an inverted signal of the first rising edge clock signal.

21. The DLL as recited in claim 20, wherein the clock feed-back unit includes:
a delay model unit which delays the delay locked clock signal for a predetermined delay time to generate a feed-backed clock signal; and
a first phase detector which receives the external clock signal and the feed-backed clock signal to generate the first comparison signal by comparing phases of the external clock signal and the feed-backed clock signal.

22. The DLL as recited in claim 21, wherein the delay means includes:
a delay line controller which receives the first comparison signal and the first and the second delay locking signals to generate a first delay line control signal and a second delay line control signal;
a first delay line which delays the first rising edge clock signal based on the first delay line control signal in order to generate the first internal clock signal;
a second delay line which delays the second rising edge clock signal based on the second delay line control signal in order to generate the second internal clock signal; and
a locking detector which receives the first comparison signal and determines whether or not the first and the second delay lines are delay locked based on the first comparison signal in order to generate the first and the second delay locking signal.

23. The DLL as recited in claim 22, wherein the duty correction means includes:
a second phase detector which receives inverted signals of the first and the second internal clock signals and determines which one of falling edges of the received signals leads the other in order to generate a second comparison signal;
a weight controller which receives the second comparison signal and the first and the second delay locking signals in order to generate a weight value; and
a phase mixer which receives the first and the second internal clock signals to generate the delay locked clock signal by mixing phases applying the weight value to the second internal clock signal and a second weight value to the first internal clock signal, wherein the second weight value is a value of subtracting the weight value from 1.

24. The DLL as recited in claim 23, wherein the weight value includes a first selection signal, a second selection signal, a first selection bar signal and a second selection bar signal.

25. The DLL as recited in claim 24, wherein the weight value is determined based on logic states of the first selection signal, the second selection signal, the first selection bar signal, the second selection bar signal and the second comparison signal.

26. The DLL as recited in claim 25, wherein the phase mixer includes:
a first phase selector for correcting a phase of the first internal clock signal based on the first and the second selection signals and the first and the second selection bar signals; and
a second phase selector for correcting a phase of the second internal clock signal based on the first and the second selection signals and the first and the second selection bar signals.

27. The DLL as recited in claim 26, wherein the first phase selector includes a plurality of unit phase mixers each of which receives the first and the second selection signals or the first and the second selection bar signals.

28. The DLL as recited in claim 27, wherein each of the plurality of unit phase mixers includes:
a first PMOS transistor whose source and gate are respectively connected to a power supply voltage and one of the first and the second internal clock signals;

a second PMOS transistor whose source and gate are respectively connected to a drain of the first PMOS transistor and one of the first and the second selection signals and the first and the second selection bar signals;

a first NMOS transistor whose source and gate are respectively connected to a ground and one of the first and the second internal clock signals; and a second NMOS transistor whose drain and gate are respectively connected to a grain the second PMOS transistor and one of the first and the second selection signals and the first and the second selection bar signals.

* * * * *

UNITED STATES PATENT AND TRADEMARK OFFICE
CERTIFICATE OF CORRECTION

| | |
|---|---|
| PATENT NO. | : 7,046,059 B2 |
| APPLICATION NO. | : 10/883332 |
| DATED | : May 16, 2006 |
| INVENTOR(S) | : Kwak |

It is certified that error appears in the above-identified patent and that said Letters Patent is hereby corrected as shown below:

Col. 16, Ln. 29, please delete "these cond" and insert -- the second --.

Signed and Sealed this

Twenty-sixth Day of June, 2007

JON W. DUDAS
*Director of the United States Patent and Trademark Office*